United States Patent
Jacobsen et al.

(10) Patent No.: US 6,863,219 B1
(45) Date of Patent: Mar. 8, 2005

(54) APPARATUSES AND METHODS FOR FORMING ELECTRONIC ASSEMBLIES

(75) Inventors: Jeffrey Jay Jacobsen, Hollister, CA (US); Roger Green Stewart, Morgan Hill, CA (US)

(73) Assignee: Alien Technology Corporation, Morgan Hill, CA (US)

( * ) Notice: Subject to any disclaimer, the term of this patent is extended or adjusted under 35 U.S.C. 154(b) by 21 days.

(21) Appl. No.: 09/932,515

(22) Filed: Aug. 17, 2001

(51) Int. Cl.[7] .............................................. G06K 19/06
(52) U.S. Cl. ...................... 235/492; 235/488; 235/489
(58) Field of Search ................................ 235/492, 488, 235/489, 486, 487; 438/106, 107, 110, 455, 457; 156/665.1

(56) References Cited

U.S. PATENT DOCUMENTS

| | | | | |
|---|---|---|---|---|
| 4,746,787 A | * | 5/1988 | Suto et al. .................. | 235/379 |
| 4,797,542 A | * | 1/1989 | Hara ........................... | 235/380 |
| 5,545,291 A | * | 8/1996 | Smith et al. ................. | 438/107 |
| 5,674,785 A | * | 10/1997 | Akram et al. ................. | 438/15 |
| 6,281,038 B1 | * | 8/2001 | Jacobsen et al. ............ | 438/106 |
| 6,291,266 B1 | * | 9/2001 | Sayyah ....................... | 438/107 |
| 6,417,025 B1 | * | 7/2002 | Gengel ....................... | 438/107 |

* cited by examiner

Primary Examiner—Michael G. Lee
Assistant Examiner—Kimberly D. Nguyen
(74) Attorney, Agent, or Firm—Blakely, Sokoloff, Taylor & Zafman LLP

(57) ABSTRACT

Apparatuses and methods for forming displays are claimed. One embodiment of the invention includes a contact smart card wherein fluidic self assembly is used to build the microelectronic structures on the display such that a contact smart data is transmitted unidirectionally. A contact smart card is inserted directly into a device that transfers data to a display coupled to the smart card. Another embodiment of the invention relates to a contactless smart card in which fluidic self assembly is also used here to build the display. Data is transmitted to an antenna that is embedded in the contactless card in which a plurality of blocks were deposited thereon.

20 Claims, 12 Drawing Sheets

APPARATUSES AND METHODS FOR FORMING ELECTRONIC ASSEMBLIES

BACKGROUND

1. Field of the Invention

This invention relates generally to a microelectronic assembly such as a smart card that includes an integrated circuit component. More particularly, the present invention relates to apparatuses and methods for forming displays coupled to a flexible card in which the display is configurable and alterable based upon data that is received from a signal that contains at least a single stream of serial data.

2. Description of Related Art

Microelectronic assemblies typically include integrated circuit components attached to substrates. Electrical interconnections are formed that allow communication between the integrated circuit component and the substrate for sending and receiving signals for processing. One type of a microelectronic assembly is a "smart card" assembly.

"Smart card" assemblies are credit card sized assemblies that include an integrated circuit component attached to a substrate. The integrated circuit component may contain information, such as access privileges, account balances, security information, or other like information. Smart card assemblies typically include a plurality of electrical contacts on the surface of the smart card that permit electrical access to information stored in the integrated circuit component for reading or writing such information. A contact smart card has a face that has a cavity for receiving electrical components such as an integrated circuit connected to electrical contacts. The electrical contacts are exposed at the surface of the smart card.

A contactless "smart card" has a substrate that has a face receiving electrical components such as an integrated circuit, an antenna and a metallic lead connected to the antenna. Contactless smart cards allow utilization of the card without having to make physical contact with a mechanical reader head, thereby making the contactless cards faster to use and their functionality more transparent to the user. An antenna is typically disposed within the card to receive a signal transmitted from a base unit and to transmit a signal back to the base unit. In a contactless card, the integrated circuit component is typically embedded in the substrate and is not attached to metal contacts on the surface of the card. In this manner, the position of the integrated circuit component is not based upon a need to be attached to metal contacts exposed at the surface of the card.

A dual interface smart card is a smart card that combines features from both the contact smart card and the contactless smart card. Dual interface smart cards include contact pads and contactless capabilities. The substrate used for contact smart cards, contactless smart cards generally comprise multiple layers that are laminated together. For example, the substrate may have three flexible layers with two protective outer layers. The flexible layers may be comprised of polyvinyl chloride (PVC), acrylonitrile butadiene styrene (ABS), polycarbonate (PC), polypropylene sulfate (PPS), or polyester (PET).

Displays form a portion of the smart card. Display panels may be comprised of active matrix or passive matrix panels. Active matrix panels and passive matrix panels may be either transmissive or reflective. Transmissive displays include polysilicon thin-film transistor (TFT) displays, and high-resolution polysilicon displays. Reflective displays typically comprise single crystal silicon integrated circuit substrates that have reflective pixels.

Liquid crystals, electroluminescent (EL) materials, organic light emitting diodes (OLEDs), up and downconverting phosphor (U/DCP), electrophoretic (EP) materials, or light emitting diodes (LEDs) may be used in fabricating flat-panel display panels. Each of these is known in the art and is discussed briefly below.

Liquid crystal displays (LCDs) can have an active matrix backplane in which thin-film transistors are co-located with LCD pixels. Flat-panel displays employing LCDs generally include five different components or layers: a White or sequential Red, Green, Blue light source, a first polarizing filter, that is mounted on one side of a circuit panel on which the TFTs are arrayed to form pixels, a filter plate containing at least three primary colors arranged into pixels, and a second polarizing filter. A volume between the circuit panel and the filter plate is filled with a liquid crystal material. This material will rotate the polarized light when an electric field is applied between the circuit panel and a transparent ground electrode affixed to the filter plate or a cover glass. Thus, when a particular pixel of the display is turned on, the liquid crystal material rotates polarized light being transmitted through the material so that it will pass through the second polarizing filter. Some liquid crystal materials, however, require no polarizers. LCDs may also have a passive matrix backplane which is usually two planes of strip electrodes which sandwich the liquid crystal material. However, passive matrices generally provide a lower quality display compared to active matrices. U/DCP and EP displays are formed in a similar fashion except the active medium is different (e.g., upconverting gas, downconverting gas, electrophoretic materials).

EL displays have one or more pixels that are energized by an alternating current (AC) that must be provided to each pixel by row and column interconnects. EL displays generally provide a low brightness output because passive circuitry for exciting pixel phosphors typically operates at a pixel excitation frequency that is low relative to the luminance decay time of the phosphor material. However, an active matrix reduces the interconnect capacitance allowing the use of high frequency AC in order to obtain more efficient electroluminescence in the pixel phosphor. This results in increased brightness in the display.

LED displays are also used in flat-panel displays. LEDs emit light when energized. OLEDs operate like the LEDs except OLEDs use organic material in the formation of the diode.

Regardless of the type of active medium used, displays are generally comprised of at least a substrate and a backplane. A backplane forms an electrical interconnection of the display and comprises electrodes, capacitors, and transistors.

FIG. 1A illustrates a rigid device in which the active matrix display backplane 10 is coupled to a rigid substrate 12. Typically, the active matrix display backplane is also rigid. FIG. 1B shows another rigid display. There, the active matrix display backplane 10 is coupled to a rigid substrate 12 (e.g., glass). Also shown is a plurality of blocks 14. These blocks may be fabricated separately and then deposited into holes on substrate 12 by a process known as fluidic self assembly; an example of this process is described in U.S. Pat. No. 5,545,291, issued to Stephen J. Smith, et al. These blocks may each contain driver circuitry (e.g., MOSFET and capacitor) for driving a pixel electrode. The active matrix backplane includes transparent pixel electrodes and row/column interconnects (not shown) to electrically interconnect the blocks 14. The plurality of blocks 14 is coupled to the active matrix display backplane 10 and the rigid substrate 12. FIG. 1C shows a reflective display 16 coupled to a rigid substrate 12. FIG. 1D shows a reflective display 16 coupled to a rigid substrate 12. A plurality of blocks 14 is coupled to the reflective display 16 and to the rigid substrate 12.

Placing elements, such as pixel drivers, on a rigid substrate is known. Prior techniques can be generally divided into two types: deterministic methods or random methods. Deterministic methods, such as pick and place, use a human or robot arm to pick each element and place it into its corresponding location in a different substrate. Pick and place methods generally place devices one at a time and are generally not applicable to very small or numerous elements such as those needed for large arrays, such as an active matrix liquid crystal display.

Random placement techniques are more effective and result in high yields if the elements to be placed have the right shape. U.S. Pat. No. 5,545,291 describes a method that uses random placement. In this method, microstructures are assembled onto a different substrate through fluid transport. This is sometimes referred to as fluidic self-assembly. Using this technique, various blocks, each containing a functional component, may be fabricated on one substrate and then separated from that substrate and assembled onto a separate rigid substrate through the fluidic self assembly process.

As noted above, FIGS. 1B and 1D illustrate a display substrate 12 with blocks 14 formed in the rigid substrate 12. These blocks 14 may be deposited through an FSA process. In the FSA process, a slurry containing the blocks 14 is deposited over the rigid substrate 12 and the blocks 14 rest in corresponding openings in the substrate 12.

FIG. 2 shows a block 14 and a circuit element (not shown) on the top surface 18 of block 14. Generally, blocks have a trapezoidal cross-section where the top of the block is wider than the bottom of the block.

FIG. 3 shows block 14 in a recessed region of the rigid substrate 12. Between the block and the rigid substrate is an eutetic layer 13. The block has a top surface 18.

FIG. 4 shows a planar side view of a rigid substrate coupled to a rigid display backplane with a plurality of blocks 14 between the display backplane 30 and substrate 12. The plurality of blocks 14 are functionally part of the display backplane 30 and are deposited onto receptor regions of the substrate 12. Each block 14 drives at least one transparent pixel electrode. The pixel is fabricated over a transistor which is fabricated in the block.

FIG. 5 shows a portion of an array in an active matrix display backplane. The control line rows 31 and 32 in this device are coupled to gate electrodes along a row and the control line columns 34 and 35 are coupled to data drivers which supply pixel voltages which are applied to the pixel electrodes. A column line 34 is connected to a source electrode of field effect transistor (FET) 36. Another column line 35 is coupled to a source electrode of FET 37. A row line 32 is coupled to the gates of both FETs 36 and 37. The drain of FET 36 is coupled through capacitor 38 to a transparent pixel electrode along the row 32 formed by FETs 36 and 37, and the drain of FET 37 is coupled through a capacitor to another pixel electrode along the row. In one typical example, the backplane may be formed by depositing blocks, using an FSA technique, into a rigid substrate (e.g., glass); each block contains a FET and a capacitor and is interconnected to other blocks by column and row conductors that are deposited onto the rigid substrate; and, the capacitor is coupled to a pixel electrode by another conductor that is deposited onto the rigid substrate. The active medium (e.g., a liquid crystal) is deposited at least on the pixel electrodes which will optically change the active medium's properties in response to the combined voltages or currents produced by the pixel electrodes. The active medium at a given pixel electrode 42 will appear as a square or dot in the overall checkerboard type matrix of the display. The actual size of the FETs and the pixel electrodes 42 are not now drawn to scale, but are shown schematically for the purposes of illustration. The interconnect between the rows and columns is comprised of flexible and conductive material. For example, the interconnect could be made of conductive polymers, metals (eg., aluminum, copper, silver, gold, etc.), metal particles, teflon materials with metal or conductive oxides.

There are disadvantages inherent to the related art. Typically, smart cards are assembled using a deterministic method of placing microelectronic structures onto the substrate. This process is time consuming and laborious. Additionally, smart cards are typically manufactured using a batch process which is not efficient.

SUMMARY

An electronic assembly such as a contact smart card and a method for making the contact smart card is disclosed in which a single input/output (I/O) connected to a display is used. This allows a serial Nth bit stream to be received such that the single I/O minimizes the chances that a security breach that may occur to a smart card. Additionally, blocks having integrated circuits are placed onto a substrate for forming a contact, contactless, or dual smart card which provides a distributed intelligence.

While an array of components (e.g., display components) for an assembly are described as examples of the invention, an array of other assemblies such as x-ray detectors, radar detectors, micro-electro-mechanical structural elements (MEMS) or, generally, an assembly of sensors or actuators or an assembly of circuit elements also may be produced using the claimed invention. Thus, for example, flexible antennas, other sensors, detectors, or an array of circuit elements may be fabricated using one of the embodiments of the inventions. Other aspects and methods of the present invention as well as apparatuses formed using these methods are described further below in conjunction with the following figures.

BRIEF DESCRIPTION OF THE DRAWINGS

The present invention is illustrated by way of example. The invention is not limited to the figures of the accompanying drawings in which like references indicate similar elements.

DETAILED DESCRIPTION

One embodiment of the invention relates to a contact smart card having a single input/output that is inserted directly into a device and data is transferred through the single input/output of the contact smart card.

Additionally, blocks having integrated circuits are placed onto a substrate for forming a contact, contactless, or dual smart card which provides a distributed intelligence.

By fabricating a flexible smart card using fluidic self assembly (FSA) described in U.S. Pat. No. 5,545,291, the cost of producing the smart card is reduced. The smart card has a smart card chip that contacts the display. The smart card also has a molded display cavity with a power, ground, single input/output interconnect formed in the backside of the display. This device may then receive signals and update data that is displayed.

The backplane of the display may be comprised of a plurality of blocks in which each block has a circuit element thereon. The blocks are contained in a slurry that is deposited onto the flexible layer. Although blocks may be comprised of a single crystal silicon or other like material that makes the block rigid, the flexible layer may still be flexible because the size of these blocks (50×100 microns or 100× 100 microns) is so small in comparison to the flexible layer. The flexible layer forms part of a display backplane. Flexible displays may be either an active matrix or a passive matrix displays.

In the following description, numerous specific details such as specific materials, processing parameters, processing steps, etc., are set forth in order to provide a thorough understanding of the invention. One skilled in the art will recognize that these details need not be specifically adhered in order to practice the claimed invention. In other instances, well known processing steps, materials, etc. are not set forth in order not to obscure the invention.

Figure 1A:
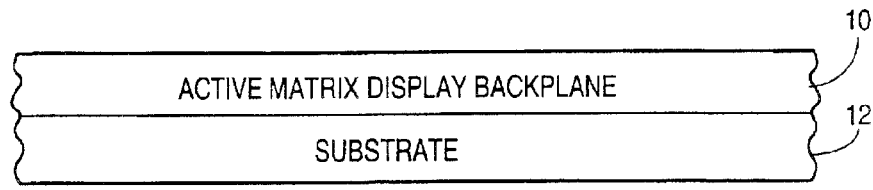
FIG. 1A shows a planar side view of an active matrix display backplane coupled to a rigid substrate of the prior art.
Figure 1B:
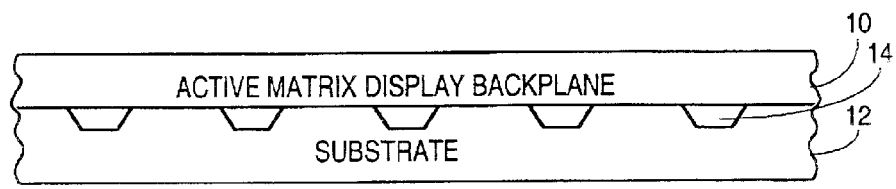
FIG. 1B shows a planar side view of an active matrix display backplane coupled to a rigid substrate wherein a plurality of blocks are part of the active matrix display of the prior art.
Figure 1C:
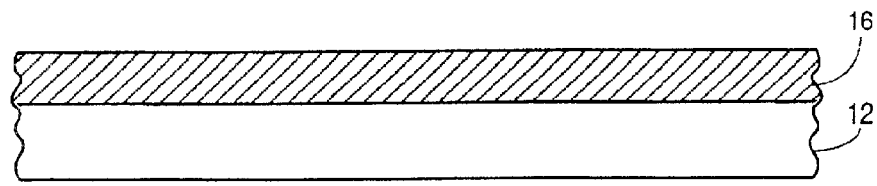
FIG. 1C shows a planar side view of a reflective display backplane coupled to a rigid substrate of the prior art.
Figure 1D:
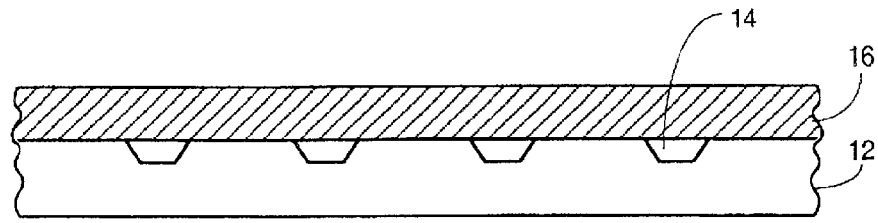
FIG. 1D shows a planar side view of a reflective display backplane coupled to a rigid substrate wherein a plurality of blocks are coupled to the reflective display and to the rigid substrate of the prior art.
Figure 2:
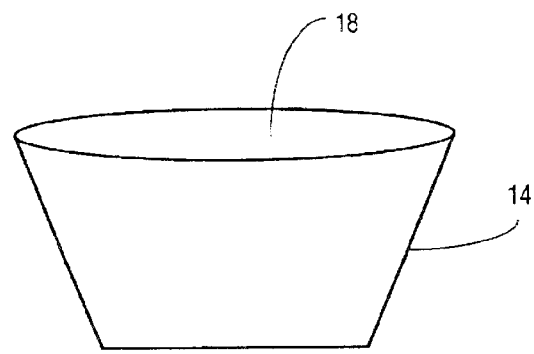
FIG. 2 shows a top perspective view of a circuit element block of the prior art.
Figure 3:
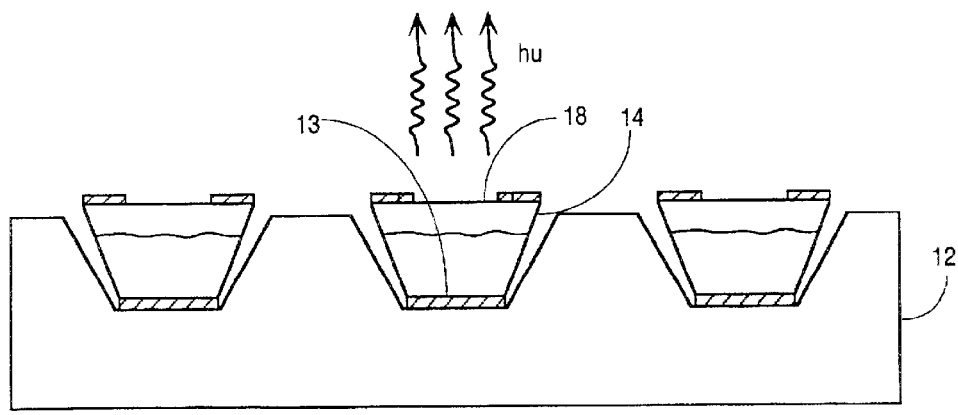
FIG. 3 shows a planar side view of blocks in recessed regions of the rigid substrate and a metalization surface on the blocks of the prior art.
Figure 4:
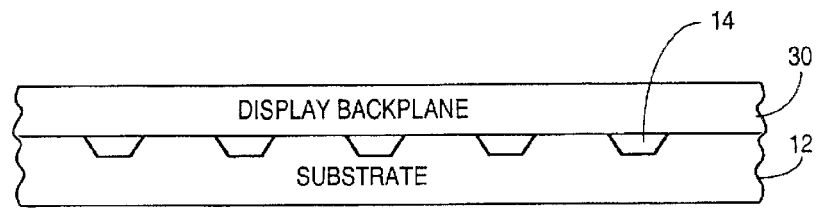
FIG. 4 shows a planar side view of a rigid substrate coupled to a rigid display backplane with a plurality of blocks between the display backplane and substrate of the prior art.
Figure 5:
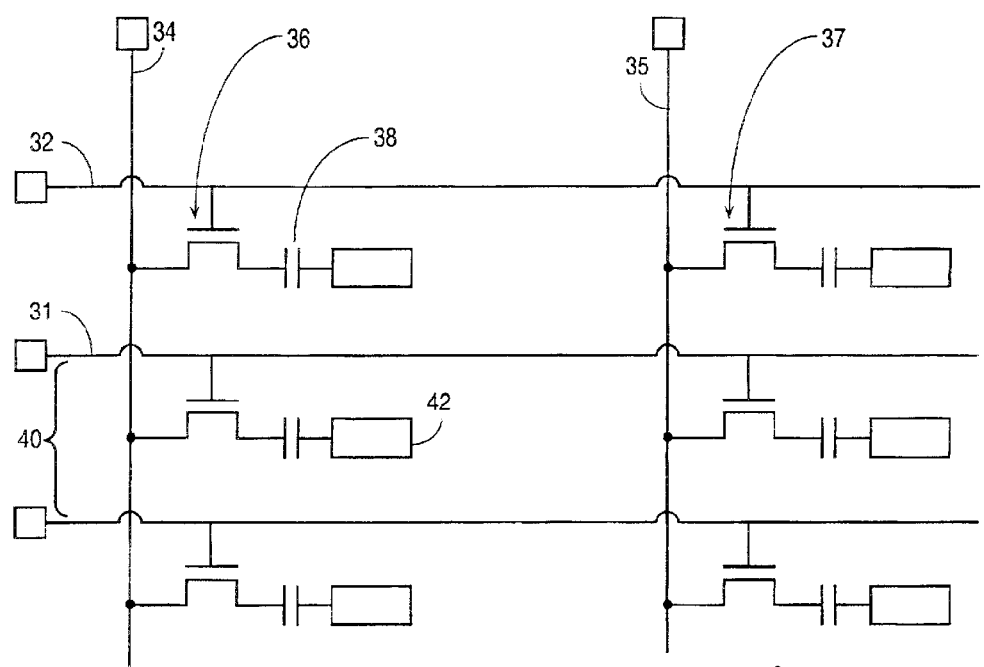
FIG. 5 schematically represents a portion of an array of an active matrix backplane of the prior art.
Figure 6A:
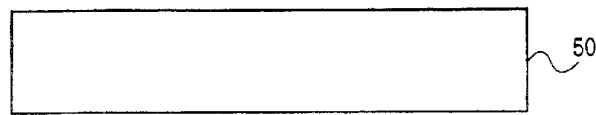
FIG. 6A shows a planar side view of a flexible layer in accordance with one embodiment of the invention.

FIGS. 6A-6E illustrate the assembly of a contact smart card in accordance with one embodiment of the invention. FIG. 6A illustrates substrate 50 that is used in this process. The substrate may be either flexible or rigid. A rigid substrate may comprise glass, metal borosilicate glass, plastic, or silicon soda lime glass, or quartz. A flexible substrate may comprise flexible substrates or layers may include polyether sulfone (PES), polyester terephthalate, polycarbonate, polybutylene terephthalate, polyphenylene sulfide (PPS), polypropylene, polyester, aramid, polyamide-imide (PAI), polyimide, aromatic polyimides, polyetherimide, metallic materials, acrylonitrile butadiene styrene, polyvinyl chloride, polypropylene sulfate (PPS) or other suitable material.

Figure 6B:
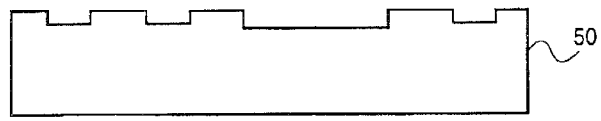
FIG. 6B shows a planar side view of a flexible layer wherein recessed regions are created in the flexible layer in accordance with one embodiment of the invention.
Figure 6C:
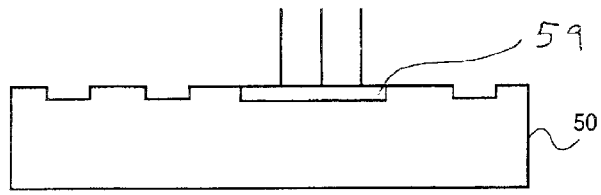
FIG. 6C shows a planar side view of a flexible layer with a receiver coupled thereto in accordance with one embodiment of the invention.
Figure 6D:
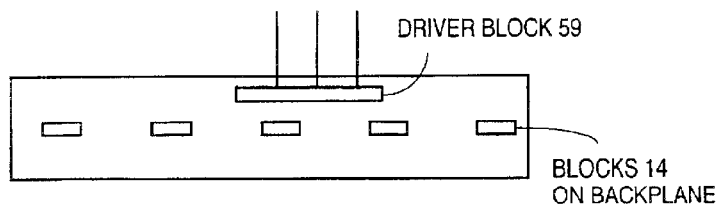
FIG. 6D shows the devices in FIG. 6C in which blocks are placed onto the flexible layer in accordance with one embodiment of the invention.
Figure 6E:
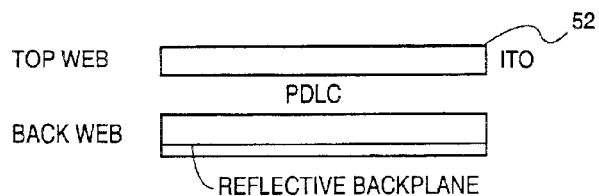
FIG. 6E shows a flexible layer before it is coupled to the device shown in FIG. 6D.

FIG. 6B illustrates substrate 50 with different sized recessed regions for receiving objects that have the electrical circuitry for the assemblies. These recessed regions may be created by a variety of methods such as using a template or roller that have a protruding structure for creating recessed regions in the substrate. Heat may be transferred to the substrate before and/or during the time in which a template or roller are used to create the recessed regions. FIG. 6C illustrates a random placement technique used such as FSA to place driver blocks 59 into recessed regions. Driver blocks constitute electrical interface to the display (e.g., smart switches). FIG. 6D illustrates blocks 14 with integrated circuits thereon placed into recessed regions of the substrate 50 using FSA. It will be appreciated that other techniques may be used to transfer blocks (e.g., display blocks and driver blocks) such as through template transfer. The display blocks are coupled to a metallic lead with an epoxy other suitable adhesive used to ensure that blocks are fixed in their location. Display blocks that have the integrated circuit thereon also may have bond pad. A wire lead may be formed between a bond pad and at least one display block. A bonding agent may be dispensed over the display blocks. The bonding agent is a conductive material such as solder paste or a conductive resin formed of metallic particles dispensed in a polymeric matrix. The bonding agent is disposed by screen printing, syringe dispensing, jetting, or the like. FIG. 6E illustrates a flexible layer 52 before it is coupled to the device in FIG. 6D.

Figure 7:
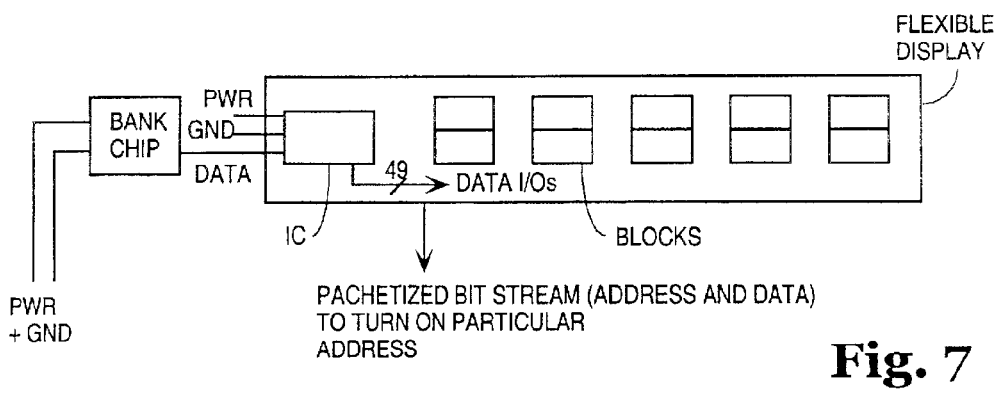
FIG. 7 illustrates a top view of a substrate having blocks coupled to a display and to an input/output lead, a ground lead, and a power lead.

FIG. 7 illustrates the top view of a substrate that has blocks deposited thereon having an integrated circuit thereon with power, ground, and data input/output leads coupled to a bank chip that transmits information such as bank account information. In one embodiment, a display interface may be manufactured with four leads or less for the transmission of data on, for example, on a smart card. A variety of data may be transmitted on the same lead such as instruction data, display data, clock, and orientation data. In another embodiment, three or more functional data such as data which is described above, are transmitted on the same lead.

Figure 8A:
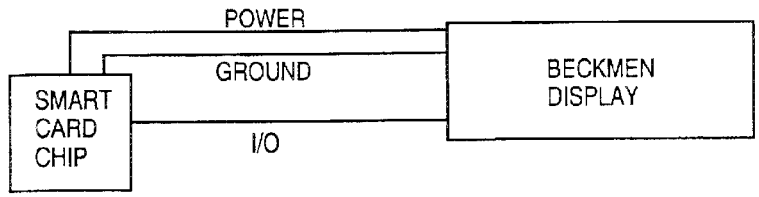
FIG. 8A illustrates a power, ground, and I/O leads coupled to a smart card chip and to a display.
Figure 8B:
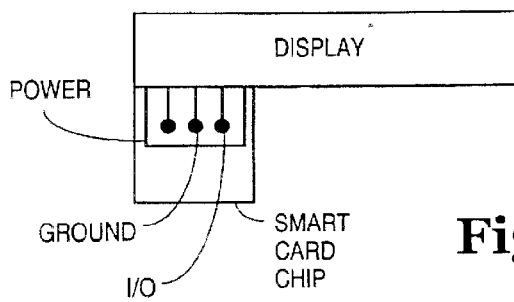
FIG. 8B illustrates a power, ground, and I/O leads coupled to a smart card chip and to a display.

FIGS. 8A and 8B illustrate the power, ground, and I/O leads coupled to a smart card chip and a display. The power, ground, I/O are connected to the smart card chip and to the display. The single I/O is used to transfer data from the smart card to a card reader. By using a single I/O, techniques of the invention offer improvements over conventional smart cards because a single I/O reduces the chances that an unscrupulous individual may breach the security of the data contained in the smart card.

Figure 9:
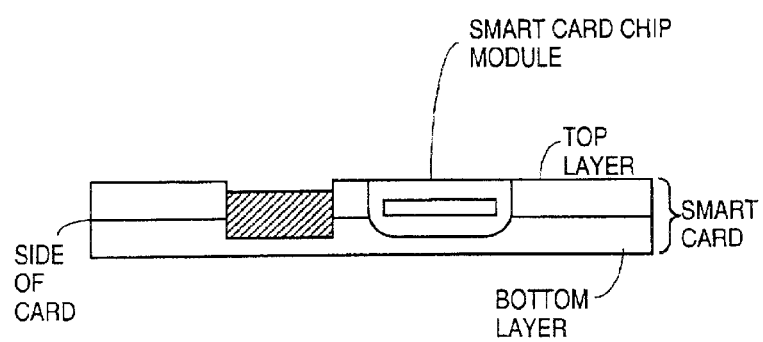
FIG. 9 illustrates the top and bottom layers to a contact smart card in accordance with one embodiment of the invention.
Figure 10:
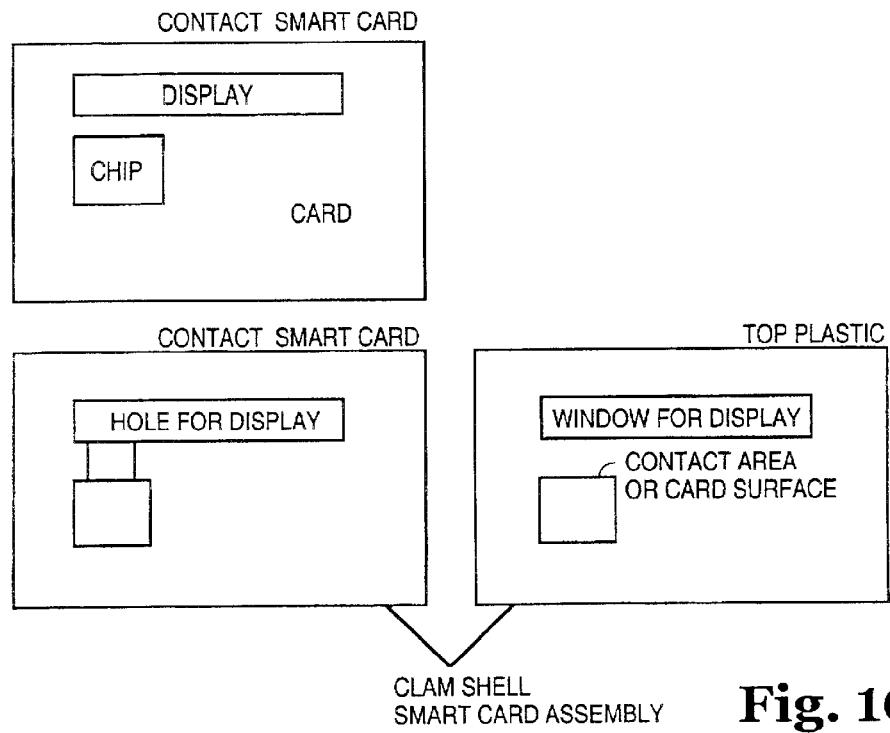
FIG. 10 illustrates a display coupled to a power, ground, and a single I/O lead in accordance with one embodiment of the invention.

FIG. 9 illustrates a contact smart card in which the top and bottom layers of the smart card are shown. The top layer has a face portion with a large receptor region for the display. In this embodiment, the top and bottom layer are comprised of a flexible material such as plastic. The large receptor region display in the top layer of the smart card may be used for the window of the display. When the contact smart card is inserted into a device that is capable of electrically mating with the contact smart card, data may be electronically transferred over the single input/output of the contact smart card discussed above. This data then is stored in a memory (not shown) within the blocks or coupled to the blocks. The display is the updated on the contact smart card. This is accomplished by the chip being coupled to the display and to a power, ground, and a single I/O lead as illustrated in FIG. 10.

Figure 11:
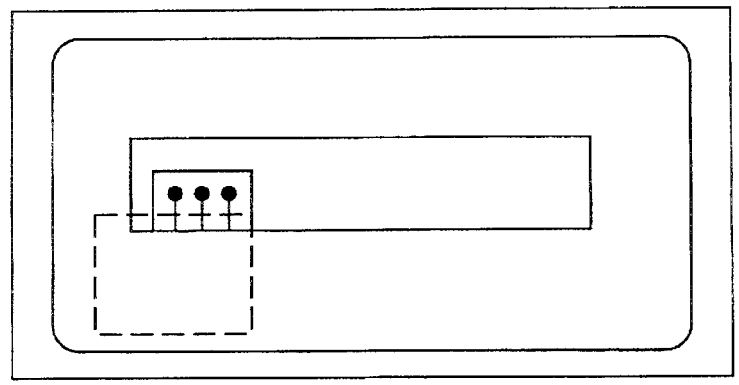
FIG. 11 illustrates a planar side view of a smart card with two layers laminated together in accordance with one embodiment of the invention.

FIG. 11 illustrates a planar side view of a smart card with at least two layers that are laminated together. Electrical components are located between the two polymeric materials. For example, in a contactless smart card, a receiver such as an antenna is embedded on the face of the bottom layer. The antenna may be formed by winding an insulated copper wire on the surface of one of the layers. The antenna may be formed of insulated metallic wire comprising a metal core surrounded by an insulating coating. Alternatively, the electrical element may be a conductive trace, a jumper trace, a capacitor, a resistor, or any electrical element that is able to send or receive signals.

A smart card chip module is embedded in the top layer and the bottom layer of the smart card. The top layer and the bottom layer may be comprised of either a rigid or a flexible substrate.

Figure 12A:
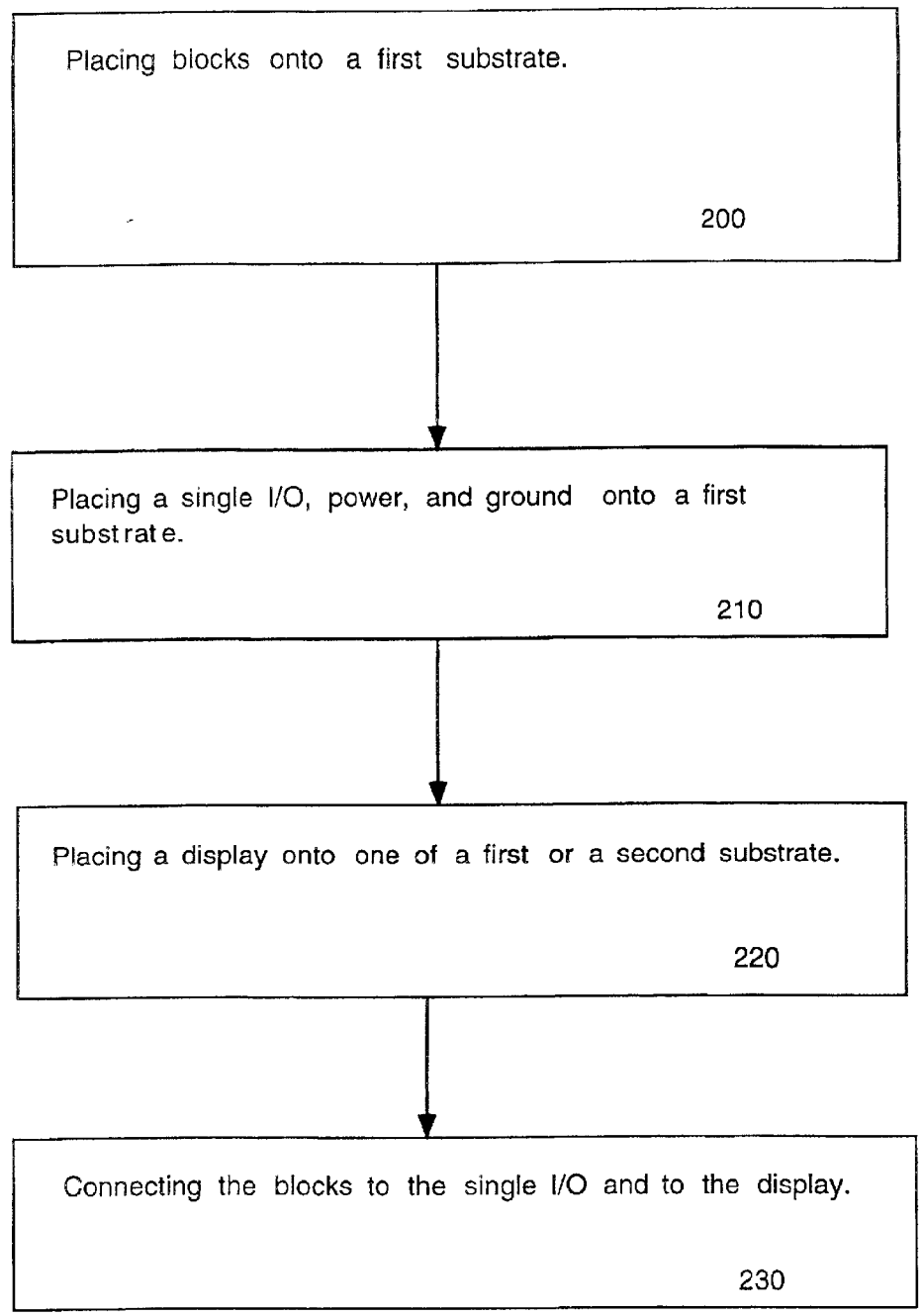
FIGS. 12A-FIG. 12B illustrate a flow diagram for forming a contact smart card in accordance with one embodiment of the invention.
Figure 12B:
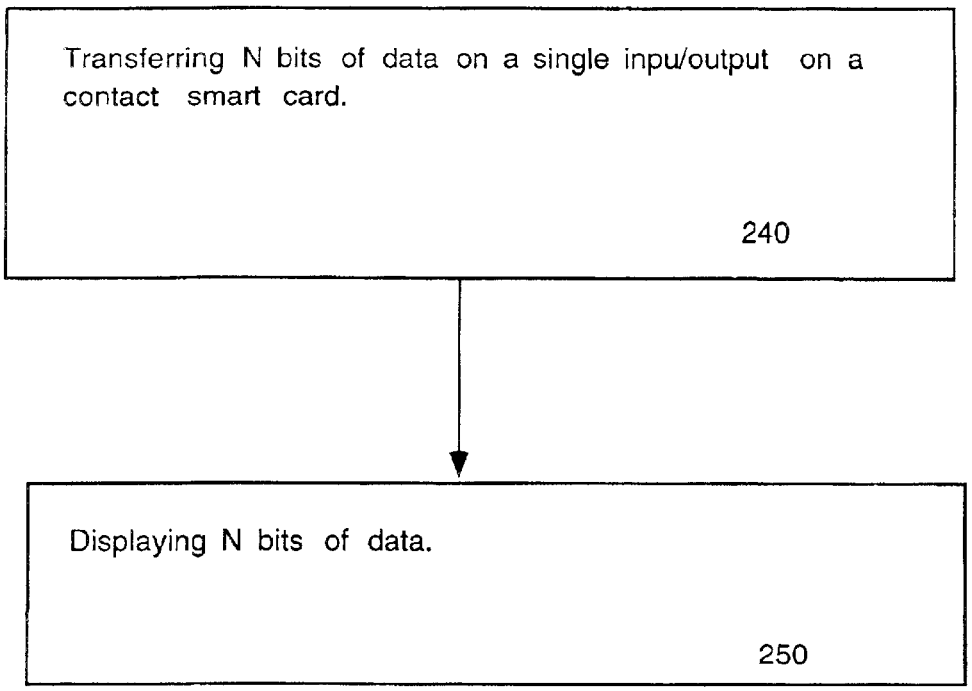

FIG. 12A and FIG. 12B illustrate a flow diagram for forming a contact smart card in accordance with one embodiment of the invention. At block 200, blocks having integrated circuits thereon are placed onto a first substrate using a random method such as FSA. At block 210, a single I/O, a power lead, and a ground lead are placed onto one of a first substrate and a second substrate. Any conventional method may be used to perform this task. At block 220, a display is placed onto one of a first or a second substrate. It will be appreciated that a display may be placed onto the first or second substrate before the I/O, power, or ground leads are placed onto one of the substrates. At block 230, the blocks are electrically connected to the single I/O and to the display by placing, for example, an interconnect onto either the first substrate or the second substrate. At block 240, N bits of data are transferred on a single I/O on a smart card. At block 250, N bits of data are displayed on the display.

Figure 13A:
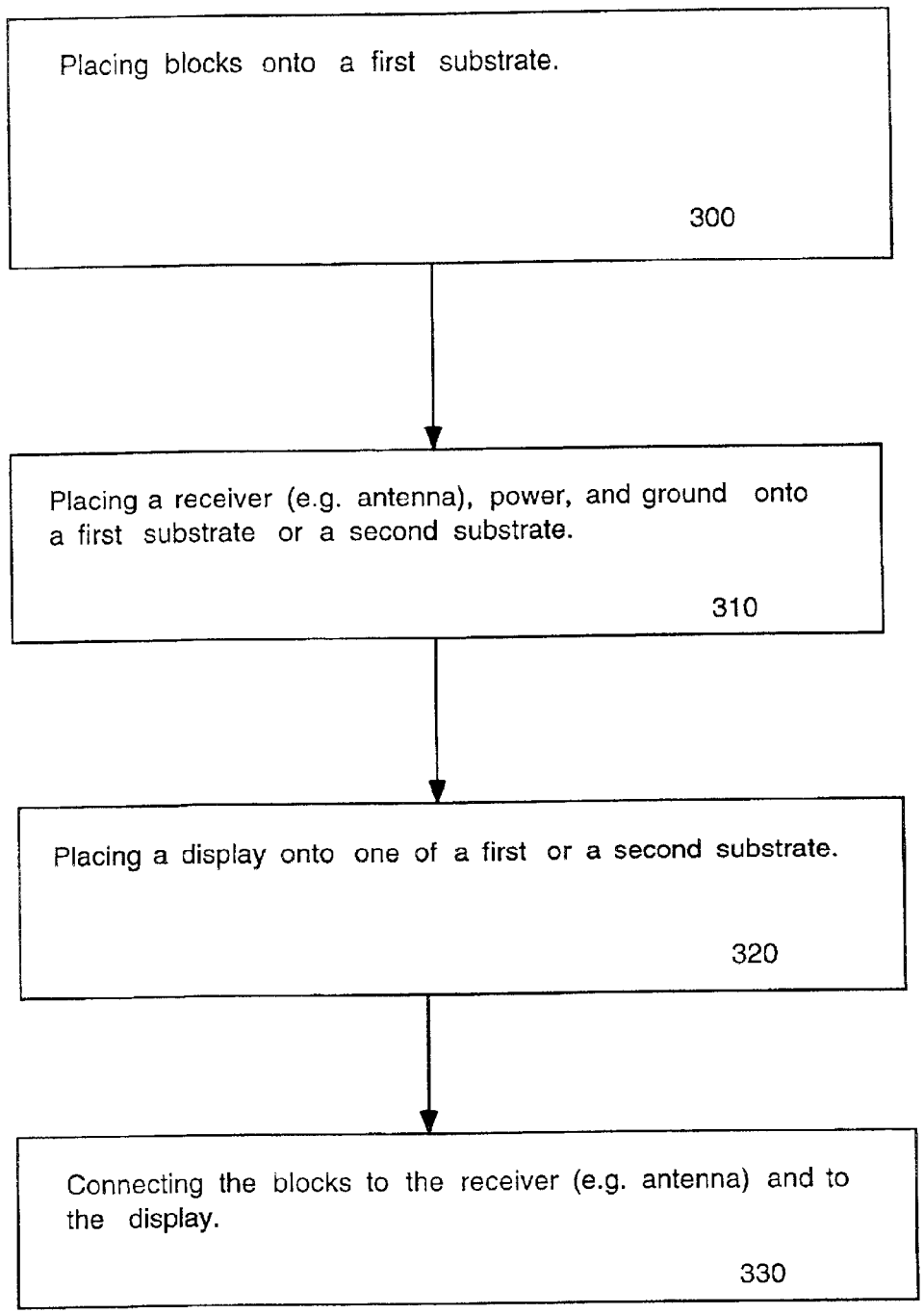
FIGS. 13A-13B illustrate a flow diagram for forming a contactless smart card in accordance with one embodiment of the invention.
Figure 13B:
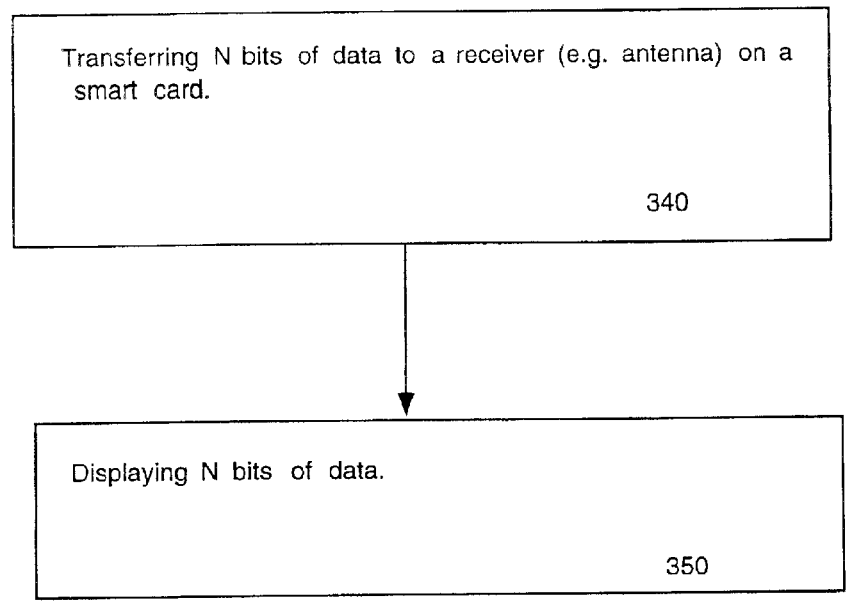

FIGS. 13A-13B illustrate a flow diagram for forming a contactless smart card in accordance with one embodiment of the invention. At block 300, blocks having integrated circuits thereon are deposited onto either a first substrate of a second substrate suing FSA. At block 310, a receiver, power lead and a ground lead are placed onto either a first substrate or a second substrate. At block 320, a display is placed onto either a first substrate or a second substrate. At block 330, the blocks are connected to a receiver. At block 340, N bits of data are transferred to a receiver on the contactless smart card. At block 350, N bits of data are displayed.

Figure 14A:
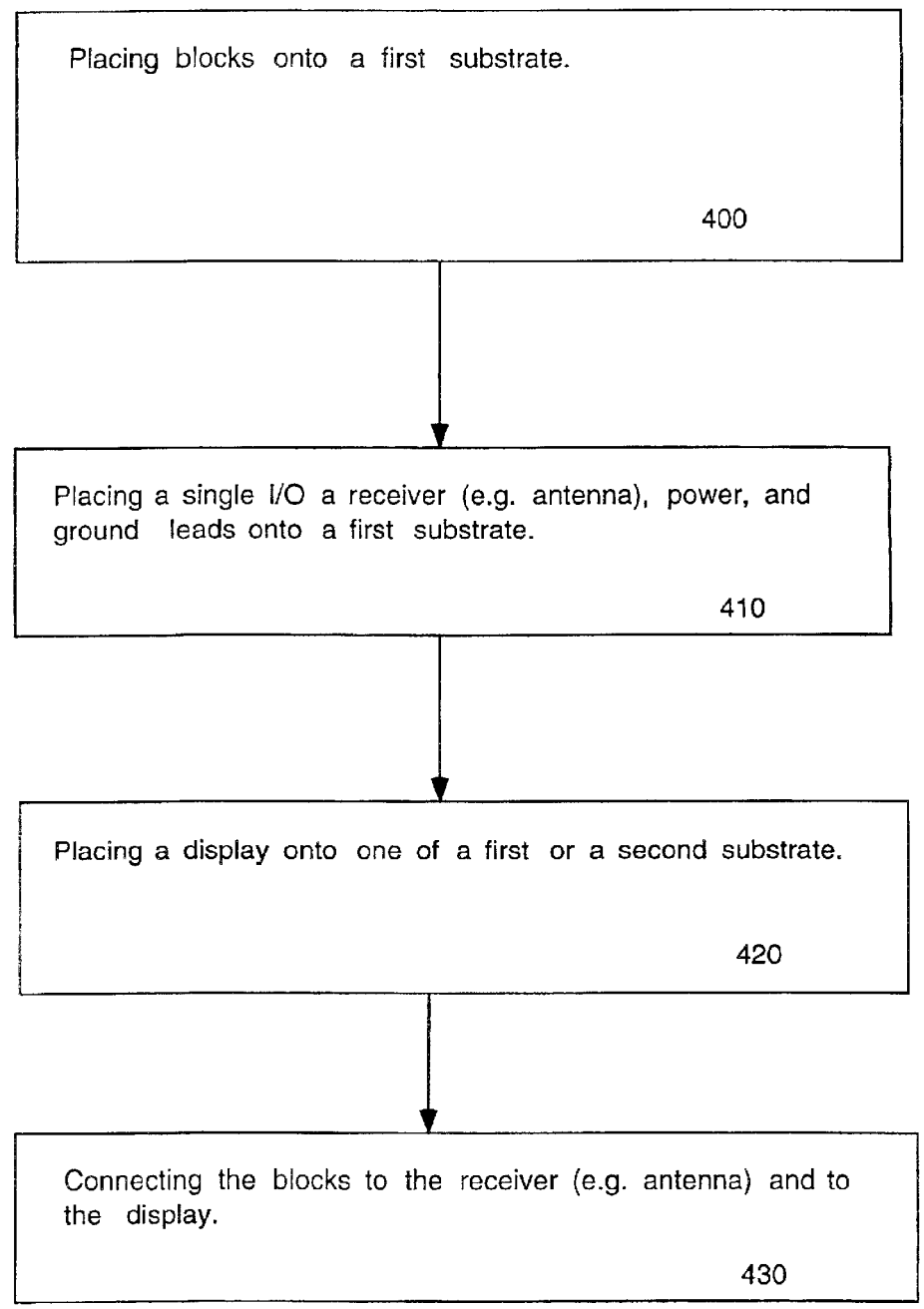
FIGS. 14A-14B illustrate a flow diagram for forming a dual smart card in accordance with one embodiment of the invention.
Figure 14B:
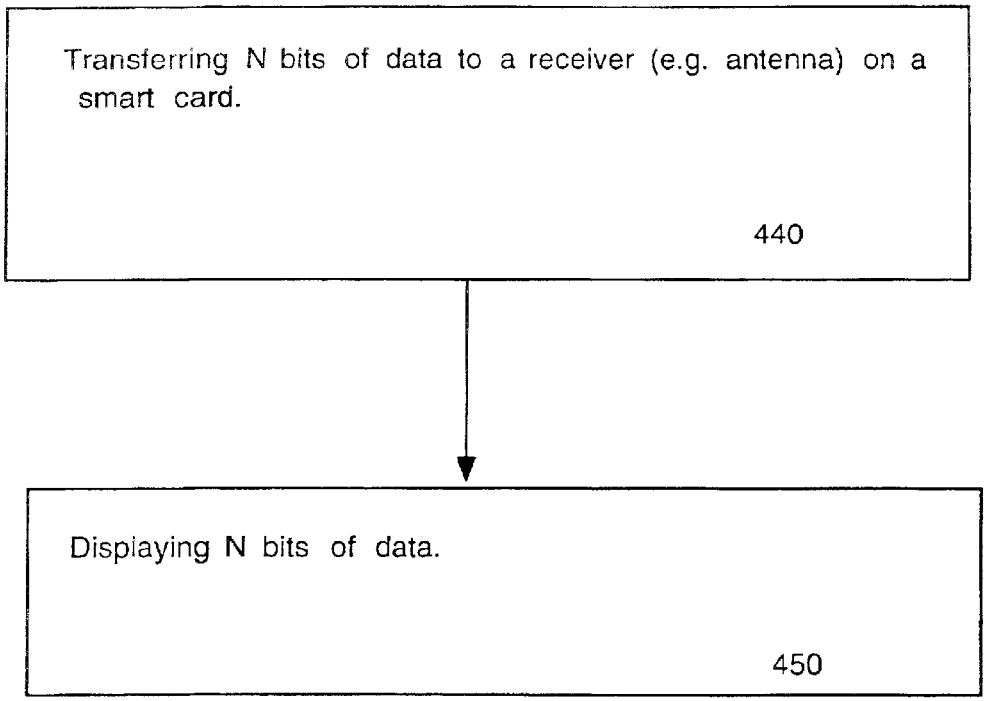

FIGS. 14A-14B illustrate a flow diagram for forming a dual smart card in accordance with one embodiment of the invention. At block 400, blocks are placed onto a first substrate using random placement methods. At block 410, a receiver such as an antenna, a power lead, and a ground lead are placed onto a first substrate. At block 420, a display is placed onto a first or second substrate. Dual smart cards generally use LCDs, contact smart cards may be used with a variety of displays such as LCDs, EL displays, LEDs, OLEDs, U/DCP displays, and EP displays. At block 430, the blocks are connected to the receiver and to a display using conventional means. At block 440, N bits of data are transferred to a receiver such as an antenna on a dual smart card. At blocks 450, N bits of data are displayed.

Listed below are related U.S. Patent Applications that describe various improvements to the methods and devices of the invention described herein. These patent applications are incorporated by reference.

Co-pending U.S. Provisional patent application Ser. No. 60/118,887 entitled "Apparatuses and Methods for Forming Assemblies" filed by Jeffrey Jay Jacobsen and assigned to the same Assignee as the present invention, describes the formation of electronic assemblies. This co-pending application is hereby incorporated herein by reference.

Co-pending U.S. patent application Ser. No. 09/270,157 entitled "Methods for Transferring Elements From a Template to a Substrate" filed by Jeffrey J. Jacobsen, Mark A. Hadley, and John S. Smith and assigned to the same Assignee of the present invention, describes transferring elements from a template. This co-pending application is hereby incorporated herein by reference.

Co-pending U.S. patent application Ser. No. 09/270,165 entitled "Apparatus and Methods for Forming Assemblies" filed by Jeffrey Jay Jacobsen and assigned to the same Assignee of the present invention, describes rolling or pressing blocks into a substrate. This co-pending application is hereby incorporated herein by reference.

In the preceding detailed description, the invention is described with reference to specific embodiments thereof. It will, however, be evident that various modifications and changes may be made thereto without departing from the broader spirit and scope of the invention as set forth in the claims. The specification and drawings are, accordingly, to be regarded in an illustrative rather than a restrictive sense.

What is claimed is:

1. A device comprising:
   a first substrate coupled to a second substrate;
   the first substrate comprising a plurality of display blocks which are deposited onto said first substrate and an integrated circuit coupled to the display blocks, each of said plurality of display blocks fabricated separately and then deposited onto recessed regions of said first substrate;
   the integrated circuit, configured to receive a signal from an external source; and less than or equal to two I/Os coupled to at least one display block and said integrated circuit.

2. The device of claim 1, wherein the second substrate comprises one of a flexible layer and a rigid layer.

3. The device of claim 1, wherein the integrated circuit comprises at least one driver block deposited onto the first substrate, wherein the driver block is coupled to at least one display block.

4. The device of claim 1, wherein each of said shaped display blocks comprises an active circuit element which drives a picture element.

5. The device of claim 1, wherein the first substrate comprises an active matrix backplane, the device further comprises:

a display generation substrate coupled to an active matrix backplane.

6. The device of claim 5, wherein the device has liquid crystal.

7. The device of claim 5, wherein the device has at least one OLED (Organic Light Emitting Diodes).

8. The device of claim 5, wherein said active matrix display is conformal.

9. The device of claim 1, wherein said first substrate has an active matrix backplane which comprises at least one electrode for each picture element.

10. The device of claim 1, wherein at least one of the first substrate and the second substrate is flexible.

11. An apparatus comprising:

at least one pixel block deposited onto a substrate, said at least one pixel block connected to a pixel element wherein said at least one pixel block is fabricated separately and then deposited onto a recessed region of said substrate;

at least one interface block deposited onto said substrate;

said at least one pixel block and said at least one interface block electrically coupled to form an active matrix backplane;

wherein said at least one pixel block having at least one integrated circuit thereon;

wherein data are transferable to said at least one integrated circuit.

12. The apparatus of claim 11, wherein said at least one pixel block comprises an active circuit element which drives a picture element.

13. The apparatus of claim 11, further comprising:

a display generation substrate coupled to said active matrix backplane.

14. The apparatus of claim 11, wherein said active matrix display backplane comprises at least one electrode for each picture element.

15. The apparatus of claim 11, wherein said active matrix display panel is flexible and comprises a single crystal silicon transmissive display.

16. The apparatus of claim 11, wherein said active matrix display panel is flexible and comprises a single crystal silicon reflective display.

17. The apparatus of claim 11, wherein said active matrix display panel is flexible and comprises an organic light emitting diode.

18. The apparatus of claim 11, wherein said active matrix display panel is flexible and comprises upconverting phosphor.

19. A device comprising:

a first substrate;

a second substrate coupled to the first substrate;

the first substrate comprising a plurality of display blocks which are deposited onto said first substrate and an integrated circuit, said integrated circuit configured to receive a signal from an external source, each of said plurality of display blocks fabricated separately and then deposited onto recessed regions of said first substrate; and less than or equal to four I/Os coupled to at least one display block and said integrated circuit.

20. A device comprising:

a first substrate;

a second substrate coupled to the first substrate;

the first substrate comprising a plurality of display blocks which are deposited onto said fast substrate and an integrated circuit, said integrated circuit configured to receive a signal from an external source, each of said plurality of display blocks fabricated separately and then deposited onto recessed regions of said first substrate; and less than or equal to three I/Os coupled to at least one display block and a chip that transmit information.

* * * * *